United States Patent
Shi

(10) Patent No.: US 7,067,866 B2
(45) Date of Patent: Jun. 27, 2006

(54) MRAM ARCHITECTURE AND A METHOD AND SYSTEM FOR FABRICATING MRAM MEMORIES UTILIZING THE ARCHITECTURE

(75) Inventor: Xizeng Shi, Fremont, CA (US)

(73) Assignee: Applied Spintronics Technology, Inc., Milpitas, CA (US)

( * ) Notice: Subject to any disclaimer, the term of this patent is extended or adjusted under 35 U.S.C. 154(b) by 0 days.

(21) Appl. No.: 10/606,557

(22) Filed: Jun. 26, 2003

(65) Prior Publication Data

US 2004/0191928 A1    Sep. 30, 2004

Related U.S. Application Data

(60) Provisional application No. 60/458,382, filed on Mar. 31, 2003.

(51) Int. Cl.
   *H01L 27/108*    (2006.01)
(52) U.S. Cl. ..................................... 257/296
(58) Field of Classification Search ................ 257/295, 257/288; 438/3
   See application file for complete search history.

(56) References Cited

U.S. PATENT DOCUMENTS

| | | | |
|---|---|---|---|
| 5,659,499 A | 8/1997 | Chen et al. | |
| 5,940,319 A | 8/1999 | Durlam et al. | |
| 6,153,443 A | 11/2000 | Durlam et al. | |
| 6,211,090 B1 | 4/2001 | Durlam et al. | |
| 6,335,890 B1 | 1/2002 | Reohr et al. | |
| 6,538,920 B1* | 3/2003 | Sharma et al. | 365/171 |
| 6,850,455 B1* | 2/2005 | Rinerson et al. | 365/230.02 |
| 2002/0034117 A1 | 3/2002 | Okazawa | |
| 2002/0080643 A1 | 6/2002 | Ito | |
| 2002/0127743 A1 | 9/2002 | Nickel et al. | |
| 2004/0089904 A1* | 5/2004 | Bhattacharyya et al. | 257/421 |
| 2004/0179395 A1* | 9/2004 | Tsang | 365/171 |

* cited by examiner

*Primary Examiner*—Bradley K. Smith
(74) *Attorney, Agent, or Firm*—Sawyer Law Group LLP

(57) ABSTRACT

A method and system for providing magnetic memory cells in a magnetic memory is disclosed. The method and system include providing each magnetic memory element, providing a first write line and a second write line for each magnetic memory element. The magnetic memory element has a top portion and a bottom portion. The first write line is below the magnetic memory element and is electrically connected with the bottom portion of the magnetic memory element. The second write line is above the magnetic memory element. The second write line is electrically isolated from the magnetic memory element and oriented at an angle to the first write line. The magnetic memory cell allows for a simplified fabrication process, a reduced cell size, and an improved programming efficiency.

18 Claims, 14 Drawing Sheets

MRAM ARCHITECTURE AND A METHOD AND SYSTEM FOR FABRICATING MRAM MEMORIES UTILIZING THE ARCHITECTURE

CROSS-REFERENCE TO RELATED APPLICATIONS

This application is claiming under 35 USC 119(e) the benefit of provisional patent application Ser. no. 60/458,382 filed on Mar. 31, 2003.

The present application is related to U.S. patent application, Ser. No. 60/431,742 entitled "MRAM MEMORIES UTILIZING MAGNETIC WRITE LINES", filed on Dec. 9, 2002, and assigned to the assignee of the present application.

FIELD OF THE INVENTION

The present invention pertains to magnetic memories, and more particularly to a method and system for providing an architecture for nonvolatile magnetic random access memory (MRAM) that may reduce the cell size, simplify fabrication processes, and improve programming efficiency.

BACKGROUND OF THE INVENTION

In conventional magnetoresistive random access memory (MRAM) devices, the memory cells are typically programmed by magnetic fields induced by current carrying conductor lines such as copper lines or aluminum lines. Typically, two orthogonal interconnects are employed, one positioned above the magnetic memory device and the second positioned below the magnetic memory device. FIG. 1 depicts a conventional MRAM architecture including two conventional conductive lines 10 and 12. The conventional MRAM architecture also includes a memory cell 11, a conductive layer 1100, a conductive stud 8, a ground line 7, a conductive plug 5, and a transistor 13 including a gate 6, a source 3, and a drain 4. The conventional conductor lines 10 and 12 are orthogonal and used for writing data into the conventional magnetic storage element 11. The conventional magnetic storage element 11 shown is a magnetic tunneling junction (MTJ) stack 11 which is located at the intersection of and between conventional conductor lines 10 and 12. Conventional conductor line 10 and conventional conductor line 12 are often referred to as conventional word line 10 and conventional bit line 12, respectively.

The conventional MTJ stack 11 primarily includes a free layer 1104 having a changeable magnetic vector (not shown), a pinned layer 1102 with a fixed magnetic vector (not shown), and an insulator 1103 in between the two magnetic layers 1102 and 1104. Layer 1101, also included in the conventional MTJ stack 11, is usually a composite of seed layers and an anti-ferromagnetic layer that is strongly coupled to the pinned magnetic layer.

During writing, the bit line current in the conventional bit line 12 and word line current through the word line 10 yield two magnetic fields on free layer 1104. In response to is the magnetic fields generated by the bit line and word line currents, the magnetic vector in the free layer 1104 will orient in a direction depending on the direction and amplitude of the bit line and word line current. Generally speaking, writing a zero (0) requires the direction of the bit line current to be different than when writing a one (1). During reading, the transistor 13 is turned on and a small tunneling current flows through the conventional MTJ stack 11. The amount of the current flowing through the conventional MTJ stack 11 or the voltage drop across the conventional MTJ stack 11 is measured to determine the state of the memory cell. In some designs, transistor 13 is replaced by a diode, or completely omitted, and the MTJ stack 11 in direct contact with word line 10.

Although the conventional architecture using the bit line 12 and word line 10 functions, one of ordinary skill in the art will readily recognize that the amplitude of the bit line and word line current is in the order of several milli-amperes for the architecture shown in FIG. 1. A smaller writing current is desired for many memory applications.

FIG. 2 depicts one conventional architecture used to address this issue. The architecture depicted in FIG. 2 contains elements that are analogous to elements in FIG. 1. Consequently, these elements, such as the conventional MTJ stack 11' and the conventional MTJ stack 11, are labeled similarly. Such conventional architectures are described, for example, in U.S. Pat. Nos. 5,659,499, 5,940,319, 6,211,090, 6,153,443, and U.S. patent application publication Ser. No. 2002/0127743, which describe encapsulating bit lines and word lines with soft magnetic cladding layer on the three surfaces not facing MTJ 11. As shown in FIG. 2, the word line 10 and the bit line 12 are each composed of two parts: the copper core 1001 and 1201, respectively, and the soft magnetic cladding layer 1002 and 1202, respectively. Relative to the conventional architecture in FIG. 1, the soft magnetic cladding layers 1202 and 1002 can concentrate the magnetic flux associated with $I_1$ and $I_2$ onto MTJ stack 11 and reduce the magnetic field on other surfaces which are not facing MTJ stack 11. Experimental data showed that a marked improvement in write efficiency can be achieved using the conventional architecture depicted in FIG. 2.

Although the conventional MRAM architecture shown in FIG. 2 functions, one of ordinary skill in the art will readily recognize that the process of making the conventional MRAM including the lines 10' and 12' is extremely complicated. The conventional fabrication process requires 9thin film deposition steps, 5 photolithography steps, 6 etching steps, and 1 chemical mechanical polishing (CMP) step. Furthermore, none of the processes can be shared with other CMOS processes. Moreover, some of the processes, such as the CMP process and a few thin-film deposition and etching processes, need to be tightly controlled in order to achieve the designed performance. In addition to cost concerns, the complicated fabrication processes pose significant challenge to scaling to higher densities.

Accordingly, what is needed is a system and method for providing an improved MRAM architecture having simpler fabrication as well as improved performance. The present invention addresses such a need.

SUMMARY OF THE INVENTION

The present invention provides a method and system for providing magnetic memory cells in a magnetic memory. The method and system comprise providing each magnetic memory element, providing a first write line and a second write line for each magnetic memory element. The magnetic memory element has a top portion and a bottom portion. The first write line is below the magnetic memory element and is electrically connected with the bottom portion of the magnetic memory element. The second write line is above the magnetic memory element. The second write line is electrically isolated from the magnetic memory element and oriented at an angle to the first write line.

In a preferred embodiment, connection between the magnetic tunneling junction device and the selection device, which is preferably a selection transistor, is facilitated by thin film which connects the top of the magnetic element and a conductive, preferably tungsten, stud which is connected to the drain of the selection transistor. The first write line that is preferably a bit line, preferably has a thickness much smaller than its width. The bit line and the magnetic memory element may be deposited in the same deposition machine in one deposition sequence without breaking the vacuum. The width of the bit line and the dimension of the magnetic memory element in the same direction can be defined in the same photolithography and etching step. After the dimension of the magnetic memory element is defined and the connection between the magnetic tunneling junction and the isolation transistor is established, a layer of hard mask material is preferably deposited to protect the magnetic tunneling junction device from damage during further processing. This layer of hard mask material is also preferably used as the stop layer for a chemical mechanical polishing process which might be required before processing the write word line. Precise spacing between the word line and the magnetic tunneling junction device is achieved by controlling the thickness of the hard mask layer.

According to the system and method disclosed herein, the present invention provides a magnetic memory having improved efficiency and scalability and that is simpler to fabricate.

DETAILED DESCRIPTION OF THE INVENTION

The present invention relates to an improvement in magnetic memories. The following description is presented to enable one of ordinary skill in the art to make and use is the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
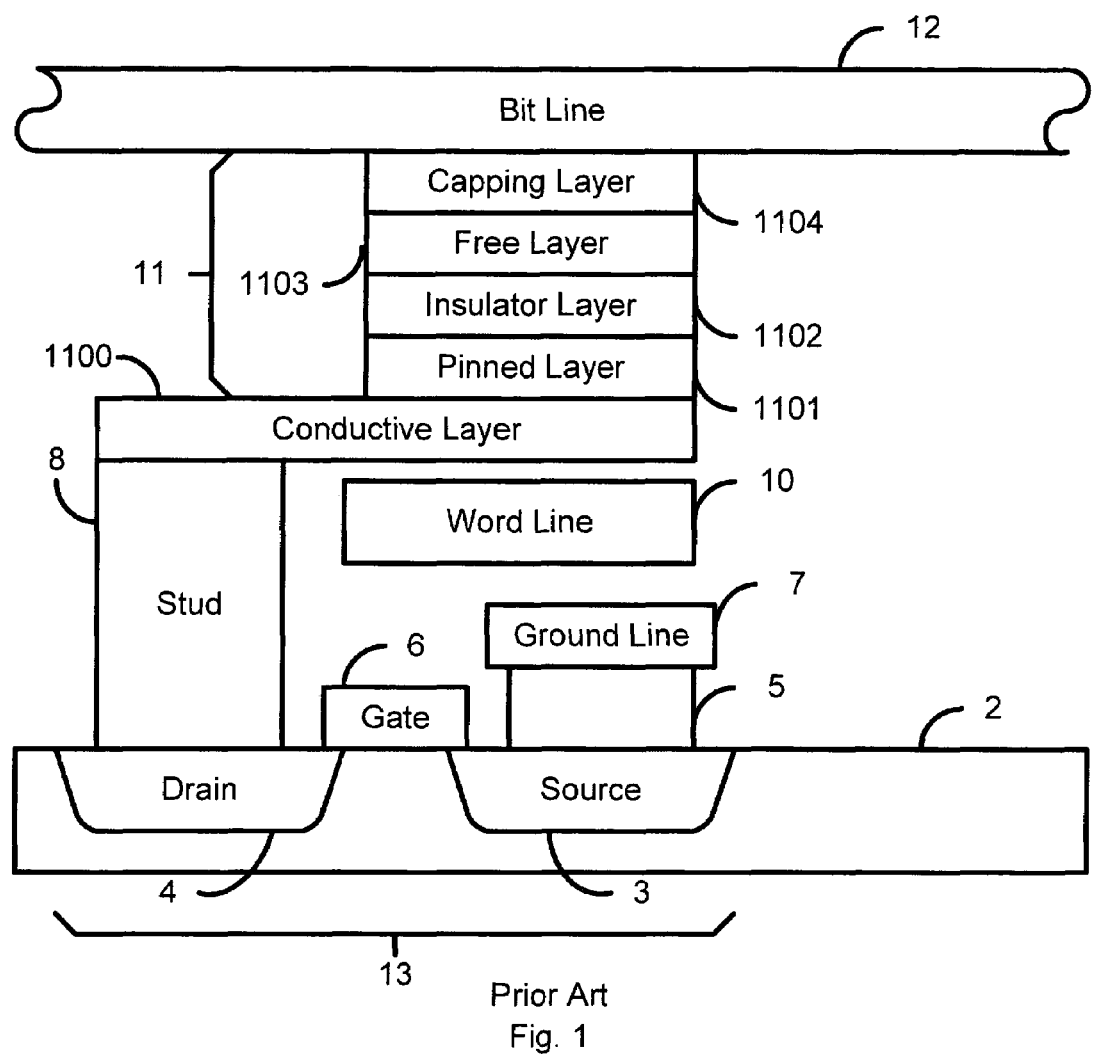
FIG. 1 depicts a conventional architecture including a conventional MTJ MRAM cell.
Figure 2:
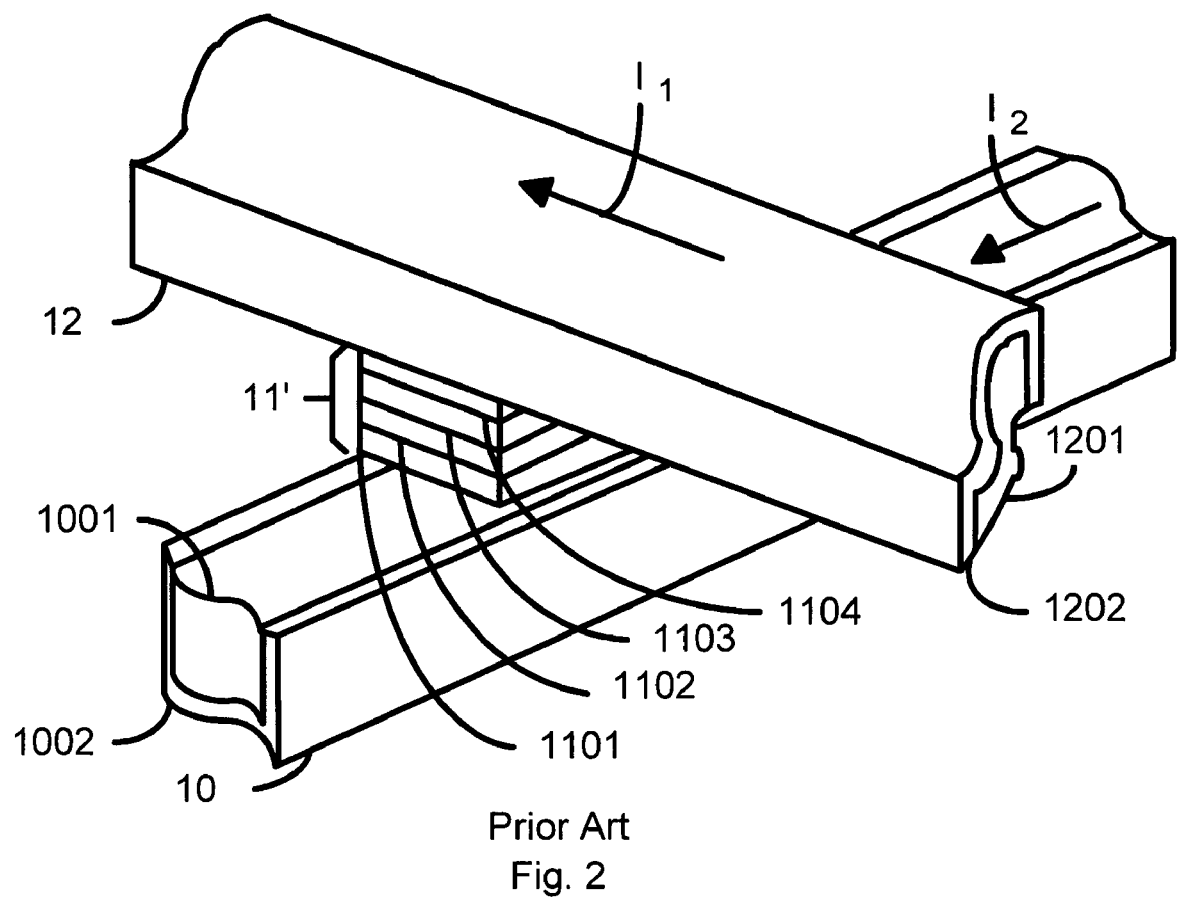
FIG. 2 depicts a three-dimensional view of another conventional architecture including a conventional MTJ MRAM cell and a bit line and word line have magnetic cladding layer.
Figure 3:
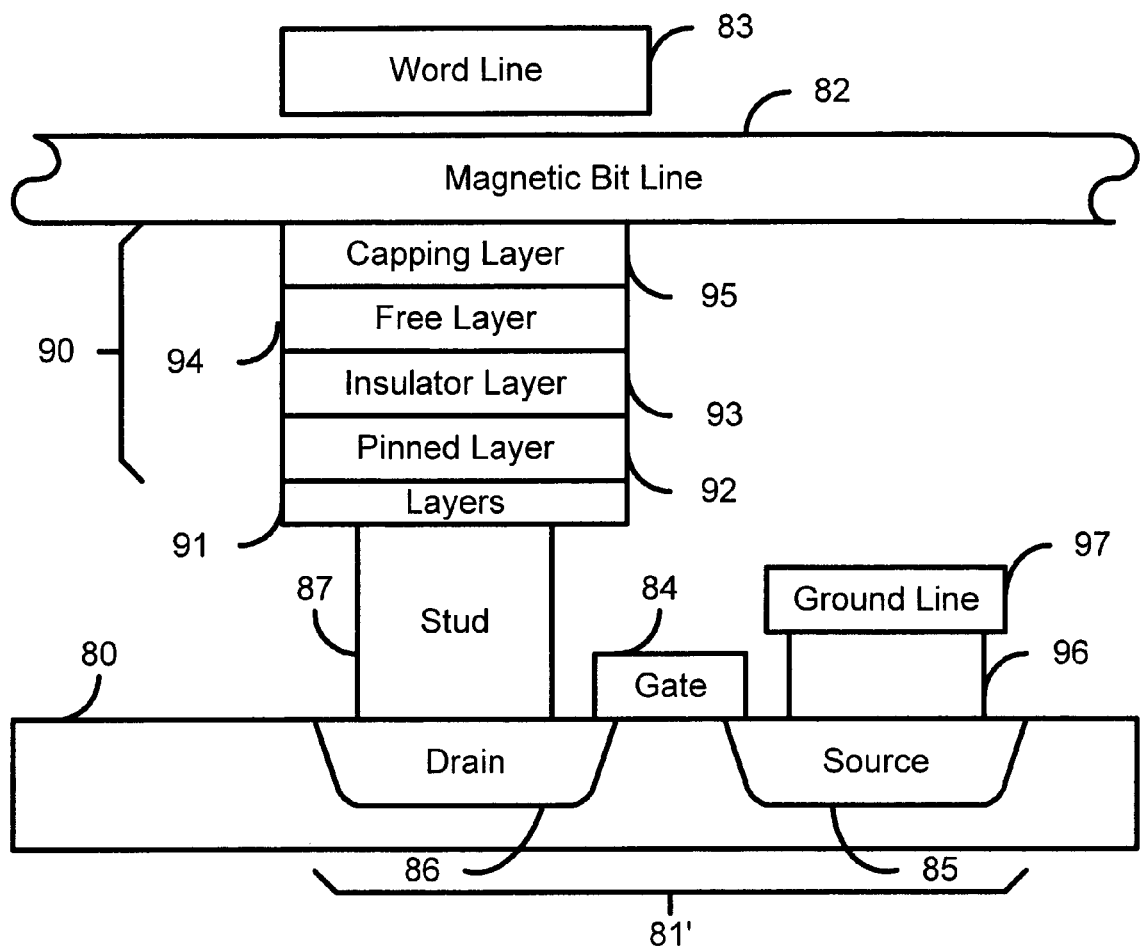
FIG. 3 depicts a cross-sectional view of an architecture including a MTJ MRAM cell.

Co-pending U.S. patent application Ser. No. 60/431/742 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application. FIG. 3 depicts one embodiment of the basic structure described in the above-identified co-pending application. The MRAM architecture depicted in FIG. 3 includes a magnetic element 90, which is preferably a MTJ stack 90, a selection device 81 formed in a substrate 80, a bit line 82, a write line 83, a conductive stud 87, connecting stud 96 and ground line 97. The selection device 81 is preferably a FET transistor including gate 84, source 85 and drain 86. The MTJ stack includes layers 91 that includes seed and, preferably, antiferromagnetic layers. The MTJ stack also includes the pinned layer 92 having a fixed magnetic vector (not shown), a tunneling layer 93, a free layer 94 having a changeable magnetic vector, and a conductive capping layer 95 that is preferably a nonmagnetic spacer layer 95.

The magnetic write line 82 includes soft magnetic materials and is separated from the free layer 94 of the MTJ stack 90 by the non-magnetic spacer layer 95. In one embodiment, the write line 83 is also magnetic. The magnetic write line 82 is preferably substantially or completely composed of a soft magnetic material. In addition, at least a core, as opposed to a cladding layer, includes the soft magnetic layer. Due to the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, write efficiency is improved.

Although the MRAM architecture described in the above-identified co-pending application functions well for its intended purpose, one of ordinary skill in the art will readily recognize that fabrication may still be complex. The function of the magnetic coupling between the magnetic vector of the magnetic write line 82 depends upon the magnetic write line 82 being laid out on a flat surface. This condition could pose significant challenge to the fabrication process. In addition, the process of etching and encapsulating the MTJ stack 90, and connecting line 82 with the MTJ stack 90 is also a very critical and difficult process. Accordingly it is highly desirable to provide an MRAM architecture which can be fabricated with a simplified wafer process while still offers high writing efficiency, scalability, and small cell size.

The present invention provides a method and system for providing magnetic memory cells in a magnetic memory. The method and system comprise providing each magnetic memory element, providing a first write line and a second write line for each magnetic memory element. The magnetic memory element has a top portion and a bottom portion. The first write line is below the magnetic memory element and is electrically connected with the bottom portion of the magnetic memory element. The second write line is above the magnetic memory element. The second write line is electrically isolated from the magnetic memory element and oriented at an angle to the first write line.

The present invention will be described in terms of particular types of magnetic memory cells, particular materials, and a particular configuration of elements. For example, the present invention will be described in the context of illustrative magnetic random access memory (MRAM) cells. One of ordinary skill in the art will, however, recognize that the present invention is not limited to any particular magnetic memory devices. Thus, one of ordinary skill in the art will readily realize that this method and system will operate effectively for other magnetic memory cells, and other materials and configurations non inconsistent with the present invention. Instead, the present invention is applicable to other magnetic memory devices, particularly those in which a reduction in process, complexity, a decrease cell size and an improvement write efficiency is desired. For example, although MTJ stacks are described as including single magnetic layers, nothing prevents the use of other materials, other alloys and synthetic layers. In addition, although the present invention is described in the context of metal-oxide-semiconductor (MOS) devices and magnetic tunneling junction (MTJ) devices, one of ordinary skill in the art will readily recognize that the present invention is not limited to such devices. Instead, other suitable devices, for example bipolar junction transistor devices and spin-valve giant magnetoresistive memory elements, may be similarly used, with or without modification to the memory architecture. One of ordinary skill in the art will also readily recognize that although the present invention is described using the terms "word line" and "bit line" are used to refer to particular lines of particular location and orientation for clarity. However, one of ordinary skill in the art will readily recognize that these terms are for reference purposes only, and can be exchanged or substituted with other names for the write lines.

Figure 4:
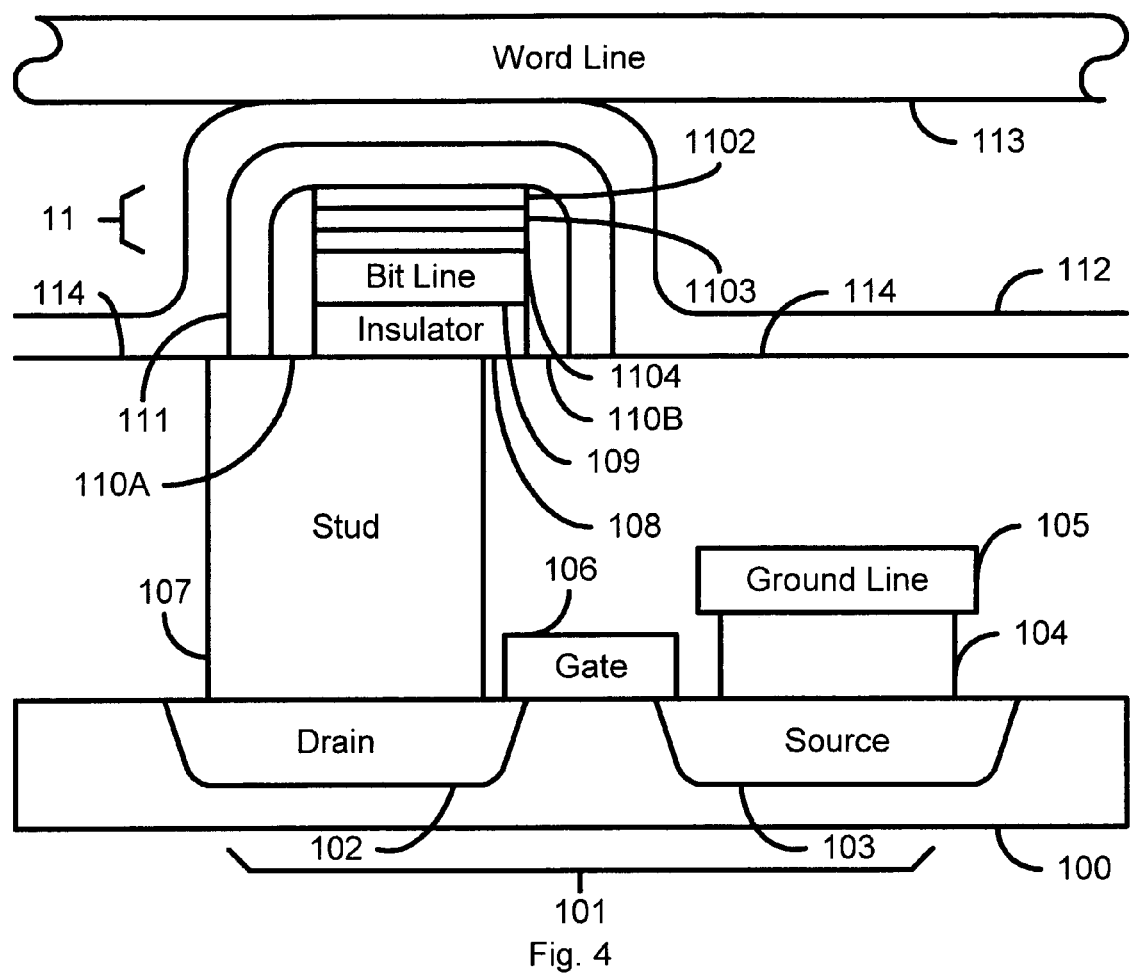
FIG. 4 depicts a cross-sectional view of one embodiment of an MRAM cell in accordance with the present invention.

To more particularly describe the present invention, refer to FIG. 4, which illustrates one embodiment of an MRAM cell in accordance with the present invention. The MRAM cell shown is preferably part of an MRAM containing an array of the MRAM cells. The MRAM cell includes a magnetic memory element 11, bit line 109, and word line 113. The magnetic memory element 11 could be a conventional memory element, but is preferably and MTJ stack 11. The bit line 109 is electrically connected to the lower portion of the MTJ stack 11, while the word line 113 resides above the MTJ stack 11 and is electrically insulated from the MTJ stack 11. The bit line 109 is oriented at an angle, preferably ninety degrees, to the word line 113. The MTJ stack 11 is located at an intersection between the bit line 109 and the word line 113. In the MRAM, the magnetic memory elements are preferably located at intersections of the bit line 109 and the word line 113. The MRAM cell also preferably includes a selection device 101 formed in a substrate 100, a ground line 105, a conductive stud 104 to the ground line 105, a conductive stud 107, insulating layer 108 separating the conductive stud 107 from the bit line 109, spacers 110A and 110B, a conductive layer 111, an insulator 112, and a dielectric 114. The selection device 101 is preferably a selection transistor 101 including a drain 102, a source 103 and a gate 106.

In a preferred embodiment, the bit line 109 is magnetic, for example being composed of a soft magnetic material or being a laminated structure having alternating soft magnetic and non-magnetic layers. In either case, the core of the bit line 109 could be considered to be magnetic. However, in an alternate embodiment, the bit line 109 could be non-magnetic, or could have a non-magnetic core and a ferromagnetic cladding layer. More specifically, the bit line 109 preferably has a thickness in the range of a few nanometers to hundreds of nanometers. In a preferred embodiment, the bit line 109 is expected to carry an electrical current in the order of milliampare. Therefore, metallic materials with good resistance against electromigration are candidates for materials preferred to be used for the bit line 109. In addition, the crystal and grain structure of the bit line 109 are also factors to be considered because the crystal and grain structure of the bit line 109 may affect the magnetic properties of the free layer 1104. The bit line 109 can also be made of soft magnetic materials to promote its write efficiency, a scheme discussed in detail in the above-identified co-pending patent application. To simultaneously optimize the different aspects of crystalline, electrical, and magnetic properties, bit line 109 may be a multilayer structure of different kind of materials, such as nonmagnetic metallic layers laminated with magnetic layer. The nonmagnetic materials for bit line may include, but are not limited to, Al, Cu, Au, W, Ti, Ta, Mo, or alloys thereof. $TiSi_2$, $WSi_2$, $CoSi_2$, TiW, and TiN are also candidates for the bit line 109 if a specific property of these kinds of materials is required. Magnetic materials, such as Co, Fe, Ni, or alloy thereof are candidates if a magnetic bit line 109 is desired.

The word line 113 shown is a simple conducting wire made of nonmagnetic metallic material. To improve write efficiency, the word line 113 may be enclosed with a soft magnetic cladding layer on the three surfaces not facing the MTJ stack 11. The soft magnetic cladding layer of the word line 113 may be electrically connected to the remainder of the word line 113 or may be isolated from the remainder of the word line 113 by a dielectric layer (not shown). In this case, the cladding layer can be in a form of continuous film spanning a plurality of word lines.

The bit line 109 has a long axis perpendicular to the page, while the word line 113 has a long axis in the plane of the page. The MTJ stack 11 includes at least free layer 1104, a tunneling layer 1103, and a pinned layer 1102. The easy axis (not shown) of free layer 1104 is preferably substantially parallel to the long axis of the word line 113. The MTJ stack 11 usually includes a layer of antiferromagnetic (AFM) material (not shown) in contact with a surface of the pinned layer 1102 not in contact with the tunneling layer 1103. The AFM material is used to fix the direction of magnetization in the pinned layer 1102. However, for simplicity, the AFM layer is omitted in the FIG. 4. The conductive layer 111 is a thin film conductor connecting the MTJ stack to a selection transistor which includes a drain 102, a source 103, and a gate 106. The insulating layer 108 insulates the bit line 109 from the stud 107. The stud 107 is preferably a metal plug connecting the conductive layer 111 to the drain 102 of the selection transistor 101. Thus, the selection transistor 101 is preferably electrically connected to the top portion of the MTJ stack 11. The word line 113 is electrically isolated from the MTJ device by the layer of insulator 112. Side wall insulating spacers 110A and 110B encapsulate the sides of the MTJ stack 11 to prevent shorting between thin-film conductor 111 and free layer 1104 as well as bit line 109. Insulating layer 108 isolates bit line 109 from the stud 107.

The MRAM cell depicted in FIG. 4 can may be programmed with data and read as follows. To program the MTJ cell 11, an electrical current is fed into the word line 113. The magnetic field associated with the word line current rotates the magnetization of free layer 1104 away from the easy axis direction. With the word line current still on, a current is fed into bit line 109. If the field produced by the bit line current is sufficiently large and has its greatest component opposite to the magnetization direction of free layer 1104, the free layer magnetization settles in a new direction after both the word line current and the bit line current (and their associated fields) are removed. Thus the data programming sequence is completed. It should be noted that the selection transistor 101 is turned off during data programming to protect the MTJ stack 11. For reading, the selection transistor 101 is turned on to allow a small current to flow from the bit line 109 through the ground line 105 through the free layer 1104, the tunneling layer 1103, the pinned layer 1102, the conductive layer 111, the stud 107, and to the selection transistor 101. The voltage drop across the MTJ stack 11 is compared with a reference to determine the state of the MTJ device and, therefore, the data stored. The high resistance state might be used to represent a "1", and the low resistance state might be used to represent a "0".

Figure 5A:
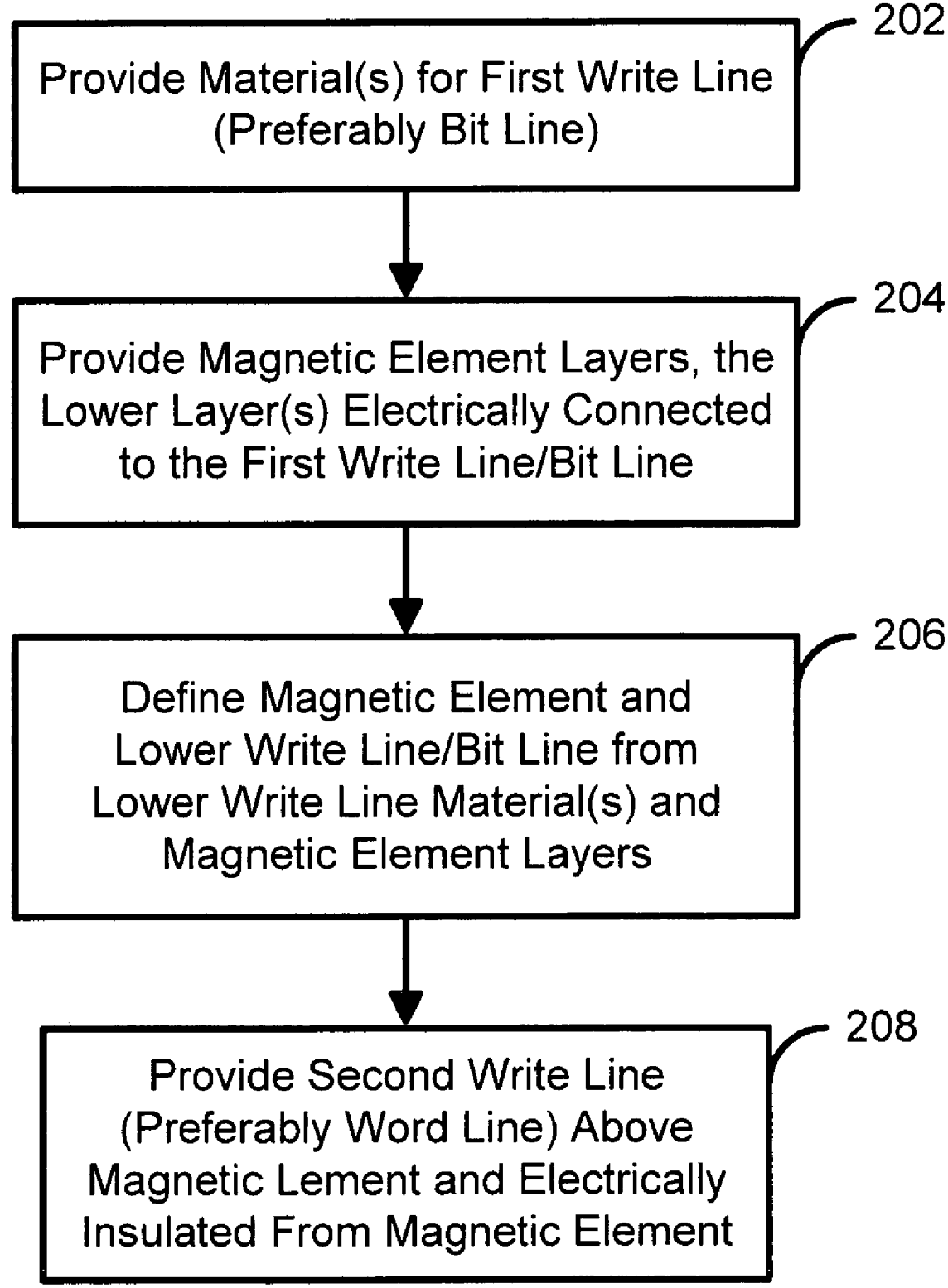
FIG. 5a depicts a high-level flow chart of one embodiment of a method in accordance with the present invention for providing an MRAM device with the present invention.

FIG. 5a depicts a high-level flow chart of one embodiment of a method 200 in accordance with the present invention for providing an MRAM device with the present invention. The method 200 preferably commences after the selection device 101, stud 107 and insulating layer 108 have been provided. One of ordinary skill in the art will readily recognize that the method 200 could be adapted to fabricate multiple MRAM cells. Furthermore, the method 200 could have fewer and/or different steps. The layer(s) for a lower write line, preferably the bit line 109, is deposited, via step 202. In a preferred embodiment, step 202 includes depositing magnetic layer(s) so that the bit line 109 is a magnetic bit line. However, in an alternate embodiment, step 202 could include depositing a non-magnetic layer with or without a ferromagnetic cladding layer. A plurality of magnetic memory element layers are provided above the write line layers, via step 204. The bottom portion of the magnetic memory element layers are electrically connected to the first write line layer. The magnetic element 11 and bit line 109 are defined from the magnetic memory element layers and the first write line layer, via step 206. Thus, the magnetic element 11 and the bit line 109 have the same dimension in the width direction of the bit line 109. A second write line, preferably the word line 113, is provided above the magnetic element 11, via step 208. The word line provided in step 208 is electrically isolated from the magnetic memory element and oriented at an angle to the first write line.

Figure 5B:
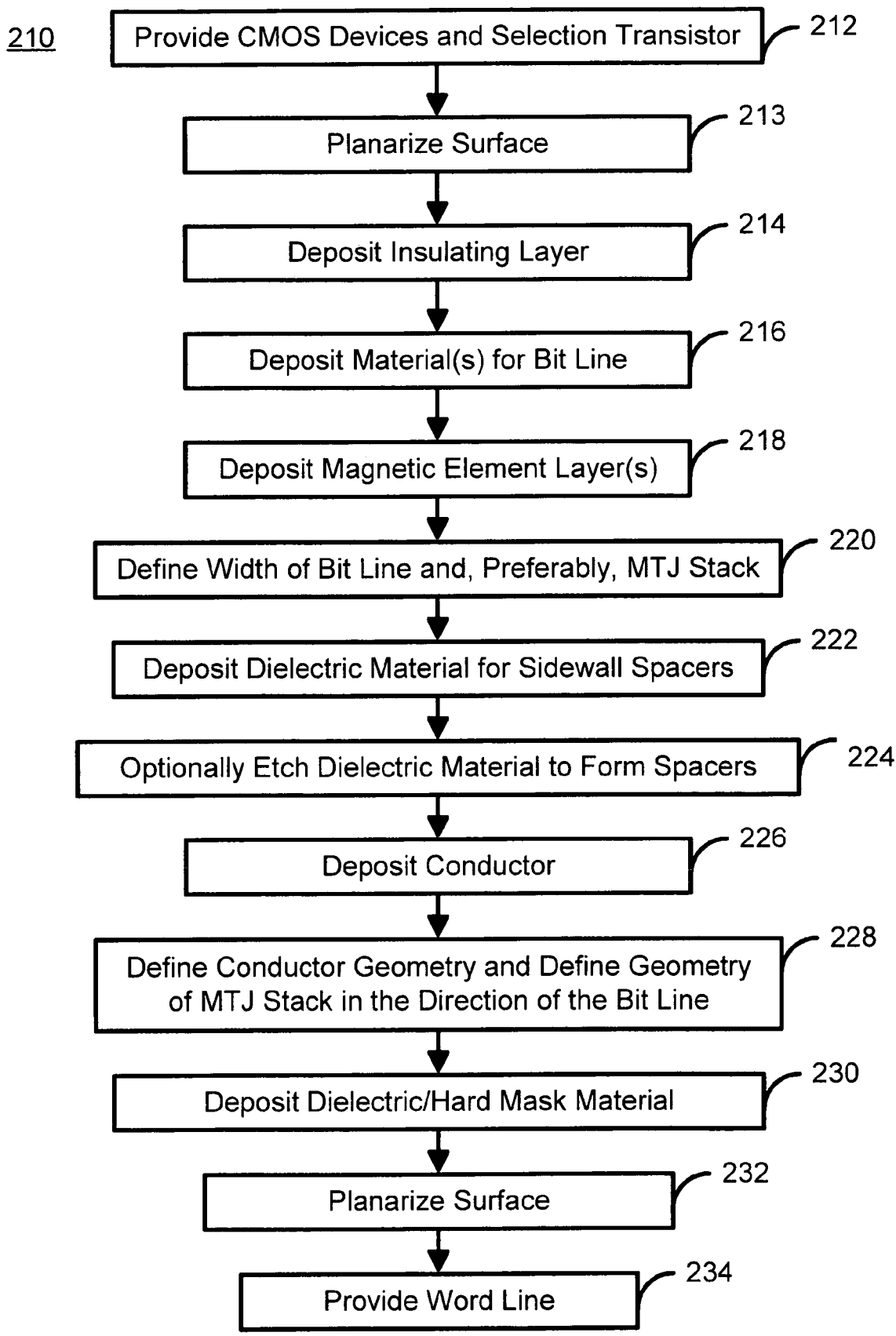
FIG. 5b depicts a preferred embodiment of a method in accordance with the present invention for providing an MRAM device in accordance with the present invention.

FIG. 5b depicts a preferred embodiment of a method 210 for fabricating an MRAM cell in accordance with the present invention. FIGS. 6a–8c depict one embodiment of an MRAM cell in accordance with the present invention during fabrication. Consequently, the method 210 will be described in conjunction with FIGS. 6a–8c. Referring to FIGS. 5b–8c, one of ordinary skill in the art will readily recognize that the method 210 could be adapted to fabricate multiple MRAM cells. Furthermore, the method 210 could have fewer and/or different steps. The selection transistor 101 and stud 107 are fabricated on a CMOS wafer, preferably using conventional CMOS processes, via step 212. A flat and smooth surface is obtained with a chemical mechanical polishing (CMP) process, via step 213. Then the wafer is preferably sent to a physical vapor deposition (PVD) machine to perform steps 214, 216, and 218. However, in another embodiment, one or more other apparatus could be used. The insulating layer 108 is deposited, via step 214. The insulating layer 108 isolates the bit line 109 from the stud 107. Therefore, good coverage and isolation should be a consideration in selecting the material for the insulating layer 108. Moreover, the smoothness and grain structure of bit line 109 and the MTJ stack 11 could be affected by the propertiesy of insulating layer 108. Accordingly, in a preferred embodiment, the material and deposition conditions for the layer 108 should be optimized to achieve good electrical and magnetic properties for bit line 109 and the MTJ stack 11. Furthermore, the etching process for the insulating layer 108 should not attack the underlying dielectric material 114. Therefore the insulating layer 108 should include materials different from the layer(s) underneath it. Consequently, candidates for the material of the insulating layer 108 include, but are not limited to materials such as $SiO_2$, $Si_3N_4$, $Al_2O_3$, and AlN.

The material(s) for the bit line 109 is deposited, via step 216. As discussed above, the materials bit line 109 may be non-magnetic, ferromagnetic, or both. The magnetic element layers including but not limited to the free layer 1104, dielectric tunneling layer 1103, and pinned layer 1102 are deposited, via step 218. In a preferred embodiment, the magnetic element layers deposited in step 218 also include seed layers and an antiferromagnetic layer for the pinned layer 1102.

Figure 6A:
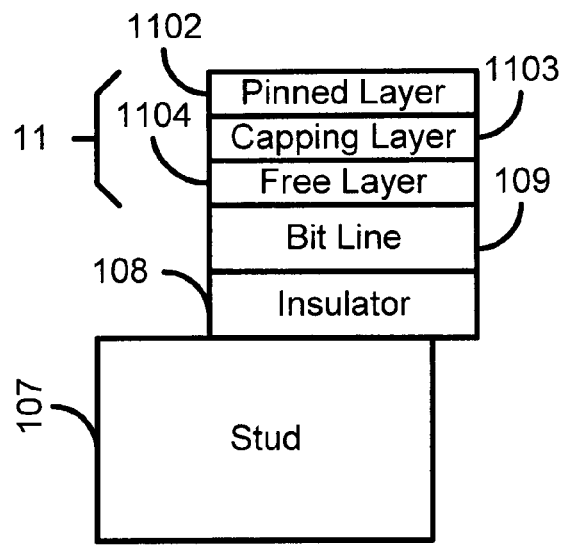
FIGS. 6a, 6b and 6c depict the cross sectional view, top view, and side view, respectively, of a portion of one embodiment of an MRAM architecture in accordance with the present invention immediately after the geometry of the bit line is defined by photolithography and etching process.
Figure 6B:
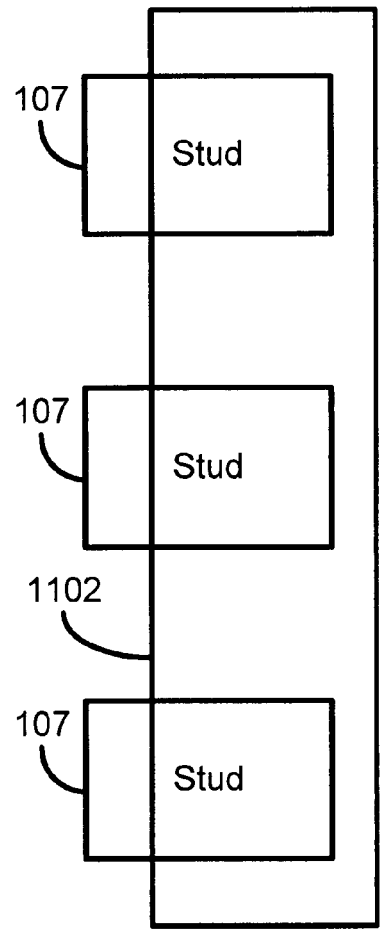
Figure 6C:
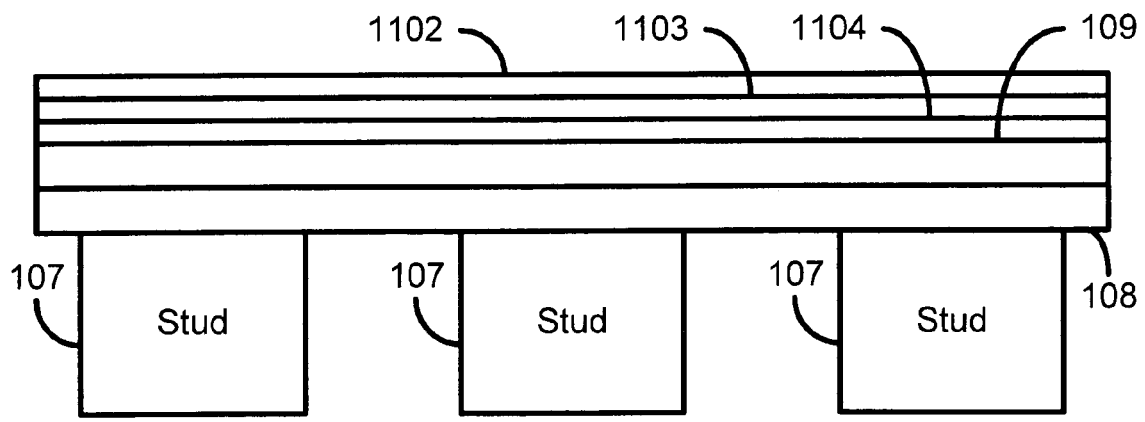

Following the deposition of the MTJ stack 11 materials and the bit line 109 structures in steps 216 and 218, photolithography and etching processes are performed to define the width of the bit line 109, via step 220. The MTJ stack 11 is also etched to the same width as bit line 82 in step 220. Therefore, perfect alignment of the bit line 109 and the MTJ stack 11 along the width of the bit line 109 (horizontally in FIG. 4) can be achieved. Because a vertical side profile is preferred, anisotropic etching by ion beam milling or reactive ion beam etching of the MTJ/bit line stack is preferred in step 220 over a wet etching process. If an ion milling process or a RIE process with significant ion bombardment is used, a sacrificial mask layer may be needed for the etching process performed in step 220. Relative to the MTJ stack 11 and the bit line 109, the mask layer material should have low sputter yield. Shown in FIG. 6a is the cross sectional view of the MRAM cells after the etching process. The selection transistor 101 is omitted for clarity. FIGS. 6b and 6c are the top view and side view, respectively, of three MRAM cells at the same stage. The studs 108, insulating layer 108, bit line 109 and MTJ stack 11 are depicted.

Figure 7A:
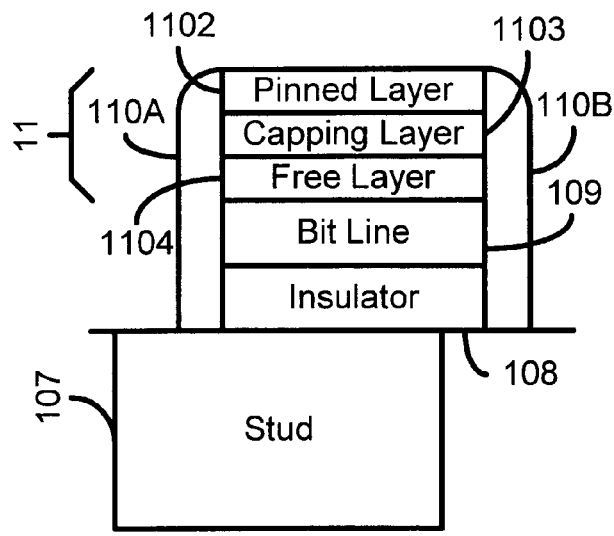
FIGS. 7a, 7b and 7c depict the cross sectional view, top view, and side view, respectively of the portion of one embodiment of the MRAM architecture immediately after the side wall dielectric spacer is formed along the edges of the MTJ/bit line stack.
Figure 7B:
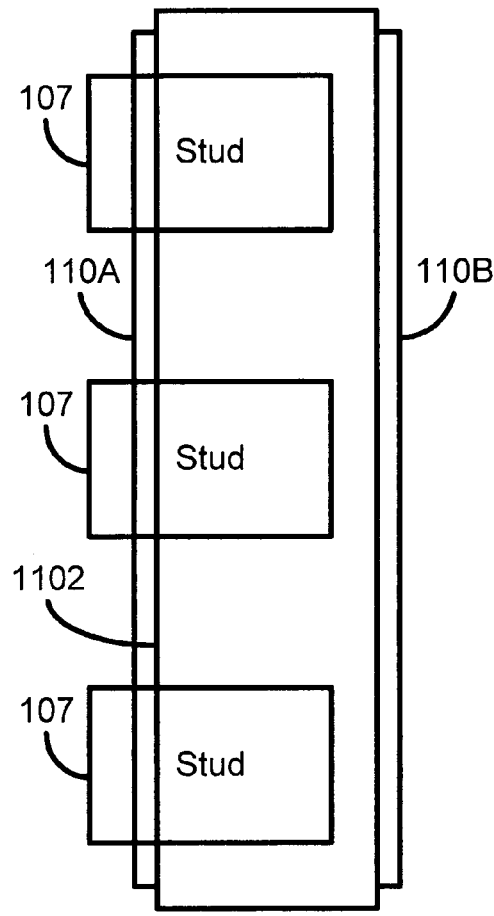
Figure 7C:
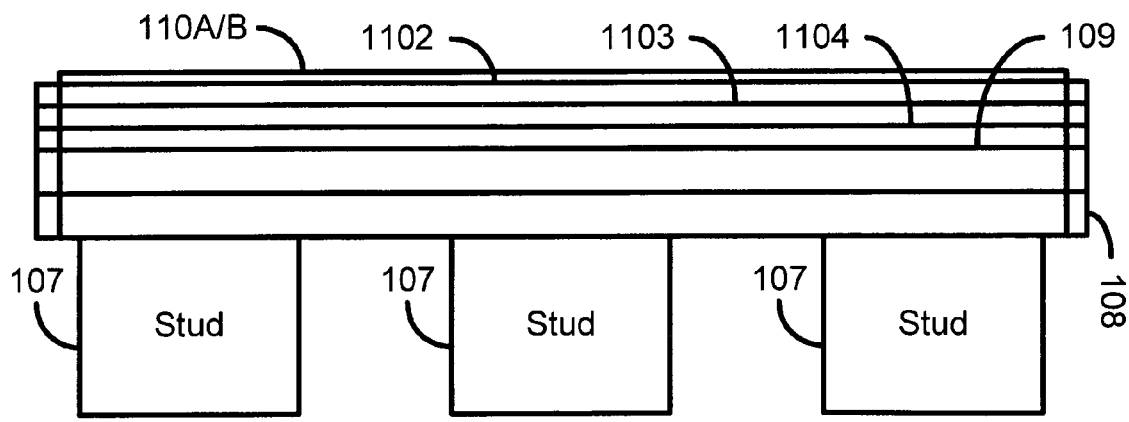

The wafer containing the MRAM cell is then preferably sent to a CVD machine for further processing. A layer of dielectric material for forming sidewall spacers 110A and 110B is deposited, via step 222. The same type of dielectric materials proposed for the insulating layer 108 may be used for the insulating spacers 110A and 110B. To achieve good etching selectivity over the dielectric layer 114 under the insulating layer 108, the material for layers 108 and 110A and 110B is different from the dielectric material 114 underneath the insulating layer 108. As an example, layers 108 and 110A and 110B can be made of $SiO_2$ if the dielectric material 114 underneath layer 108 is $Si_3N_4$. An etching selectivity of ten to one of $SiO_2$ over $Si_3N_4$ can be achieved using $C_4F_8$+CO or $C_5F_5$ as etching gas. A CVD process is preferred over a PVD process for the deposition of the material for the spacer 110A and 110B to achieve good step coverage. Following the deposition process in step 222, an anisotropic RIE is preferably used to etch away the dielectric material in the plain field while leaving insulating sidewalls 110A and 110B along the edges of the combination of the MTJ stack 11 and the bit line 109, via step 224. The process of fabricating the sidewall spacer is well known in the CMOS industry and will not be further described here. The cross sectional view of the MRAM cell at this point of the wafer process is shown in FIG. 7a. FIGS. 6b and 6c depict the top view and the side view, respectively, of three MRAM cells at the same stage. In FIGS. 7a–7c, the sidewall spacers 110A and 110B are depicted.

Figure 8A:
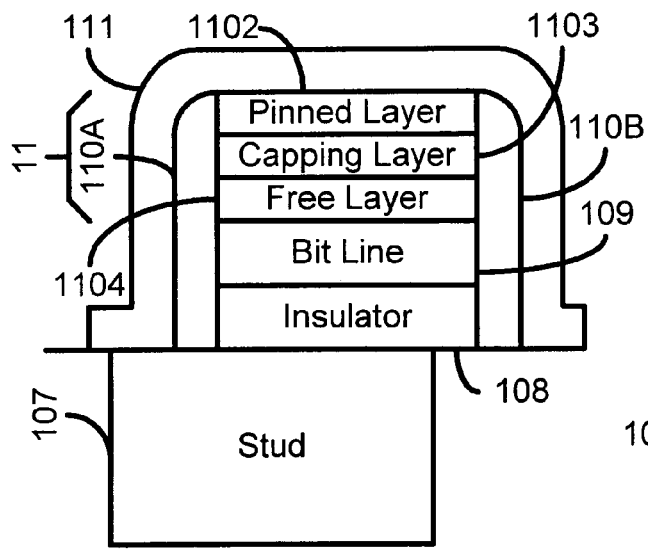
FIGS. 8a, 8b and 8c depict the cross sectional view, top view, and side view, respectively of the portion of one embodiment of the MRAM architecture immediately the geometry of the MTJ cells are defined and the connection between the MTJ and the stud is established.
Figure 8B:
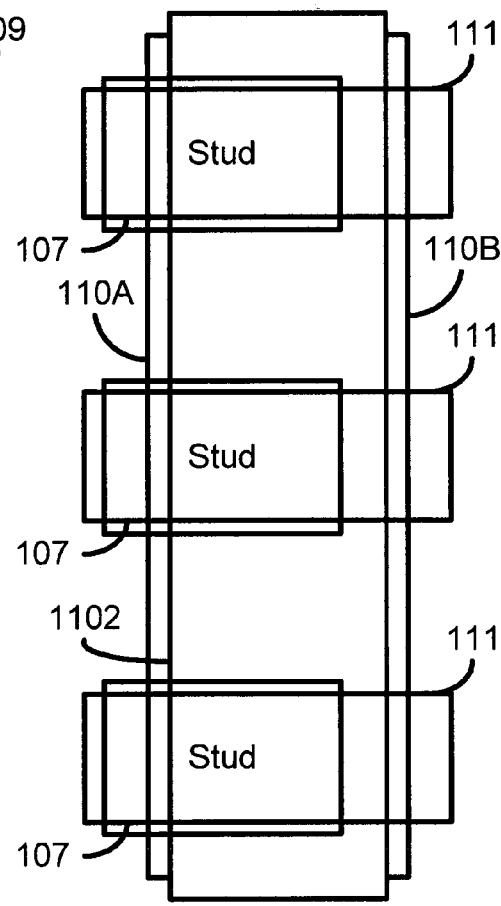
Figure 8C:
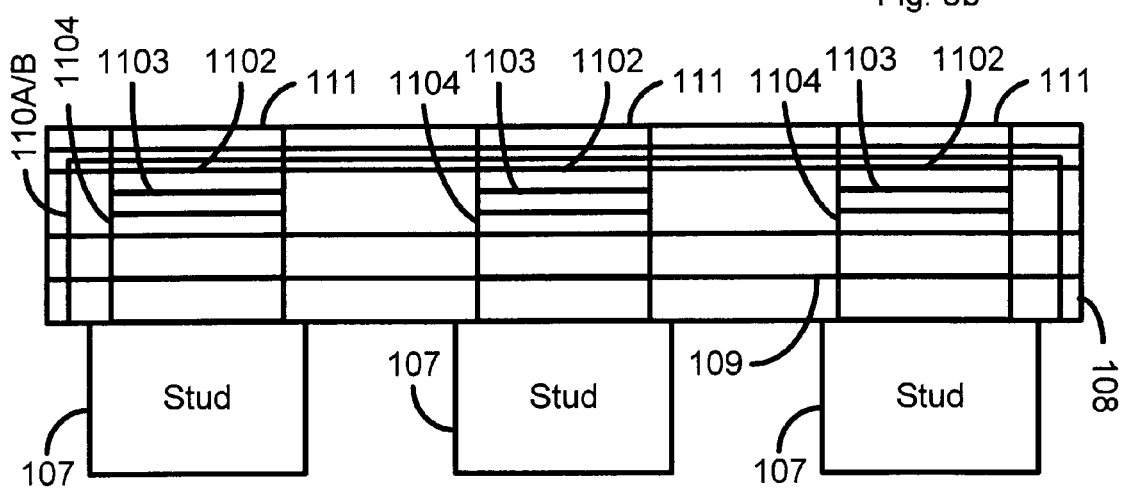

A layer of thin film conductor is then deposited on the wafer for forming the conductive layer 111, via step 226. A CVD process is preferred to achieve good step coverage, even though a PVD process may also be able to produce satisfactory results. To simplify the etching process used to define the conductive layer 111 from the layer as deposited, refractory metals, such as W, Ta, Mo, are preferred. The thickness of the film used for the conductive layer 111 is preferred to be in the range from a few nanometers to a few hundred nanometers. If this layer is also designed to be the mask layer for etching the MTJ stack 11, a thicker film is needed to compensate the thickness loss related to the MTJ etching process. The geometry of the thin-film conductor 111 and the MTJ stack 11 is defined, preferably using photolithography, via step 228. It should be noted that, except the edge where the conductive layer 111 comes down the side of the MTJ stack 11 to make contact with stud 108, the dimension of the MTJ stack 11 and the conductive layer 109 could be defined in the same photolithography process. Etch gas and etch conditions are preferably first optimized to etch the conductive layer 111 as desired in step 228. Isotropic etching process is preferred to etch the conductive layer 11 because both the plain field and the region along the edges of the MTJ stack 11 generally need to be cleaned up. The etch gas and etch condition are then preferably changed to continue step 228 to etch the MTJ stack 11 utilizing the conductive layer 111 as a mask layer. At this point of the wafer process, the cross sectional view, top view and side view of three MRAM cells are shown in FIGS. 8a, 8b, and 8c, respectively. Thus, the conductive layer 111 remaining after the etch is performed in step 228 is depicted.

A thin layer of hard mask material for the insulator 112 is then deposited, via step 230. In a preferred embodiment, a CVD process is performed to deposit the insulator 112. This hard mask layer, the insulator layer 112, preferably formed of silicon nitride or the like, will be used as the CMP stop layer on top of the MTJ stack 11. Following the deposition of another layer of dielectric material such as $SiO_2$, a CMP process is performed to prepare a flat surface to fabricate word line 113, via step 232. The hard mask layer insulator 112 is expected to protect the MTJ stack from the CMP process and yield uniform spacing between free layer 1104 and word line 113 across the full wafer. The word line 113 is then provided, via step 234 FIG. 4 depicts a cross sectional view of the MRAM cell after word line 113 is finished.

In the method 210 which fabricates the first embodiment of an MRAM cell in accordance with the present invention shown in FIG. 4, no photolithography process was used in forming the sidewall spacers 110A and 110B. Instead, a CVD dielectric layer deposition is performed in step 222 followed by an anisotropic etching process in step 224 to expose the metallic surface on the top of the MTJ stack 11 and stud 107 for thin-film conductor 112 to make the contact.

Figure 9:
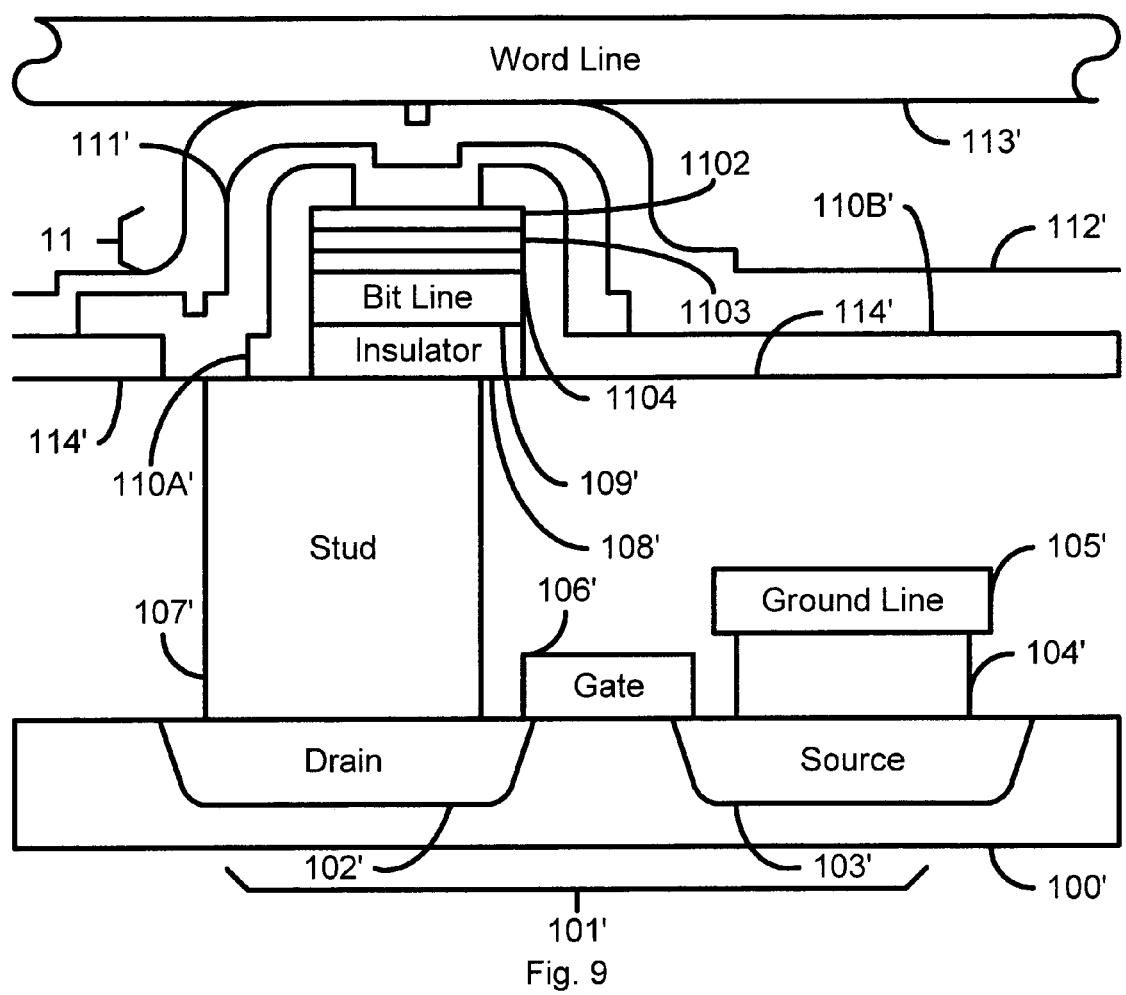
FIG. 9 is a cross-sectional view of a second embodiment of an MRAM architecture in accordance with the present invention having vias for the connection between the top of the MTJ and the stud formed using a photolithography step.

FIG. 9 depicts a second embodiment of an MRAM cell in accordance with the present invention. Many of the components of the MRAM cell are analogous to those depicted in FIGS. 4–8c. Consequently, these components are labeled similarly. For example, the bit line 109' corresponds to the bit line 109 depicted in FIGS. 4–8c. Referring to FIG. 9, the metallic surfaces on the top of the MTJ stack 11 and stud 107' are exposed by a photolithography process followed by an etching process. As a consequence, insulating layer 110', which corresponds to the sidewall spacers 110A and 110B of FIG. 4, exists not only along the edges of the MTJ stack but also in other areas. However, because an aperture in the insulating layer 110' was formed to expose the MTJ stack 11 and stud 107' as described above, the insulating layer 110' does not exist where the thin-film conductor 111' comes in contact with the stud 107' and the top of the MTJ device.

Referring back to FIG. 4, another feature shown in the first embodiment of an MRAM cell in accordance with the present invention is that the MTJ stack 11 and bit line 109 are placed partially on top of the stud 109 and partially on a surface of the dielectric layer 114. Although the MRAM cell depicted in FIG. 4 functions well for its intended purpose, a potential issue with this layout is that the metallic surface of the stud 107 and the surface of the dielectric layer 114 may not have the same degree of smoothness. In addition, and the surfaces of the two areas 107 and 114 may not be on the same level due to a phenomenon commonly referred as "dishing" in the CMP process. Additionally, the grain structures in the two areas 107 and 114 are also different. As a consequence, the portion of the MTJ stack 11 and the bit line 109 grown on the surface of the stud 108 may be different from the portion of the MTJ stack 11 and the bit line 109 grown on the dielectric surface. This difference can negatively impact the performance of the MRAM device.

Figure 10:
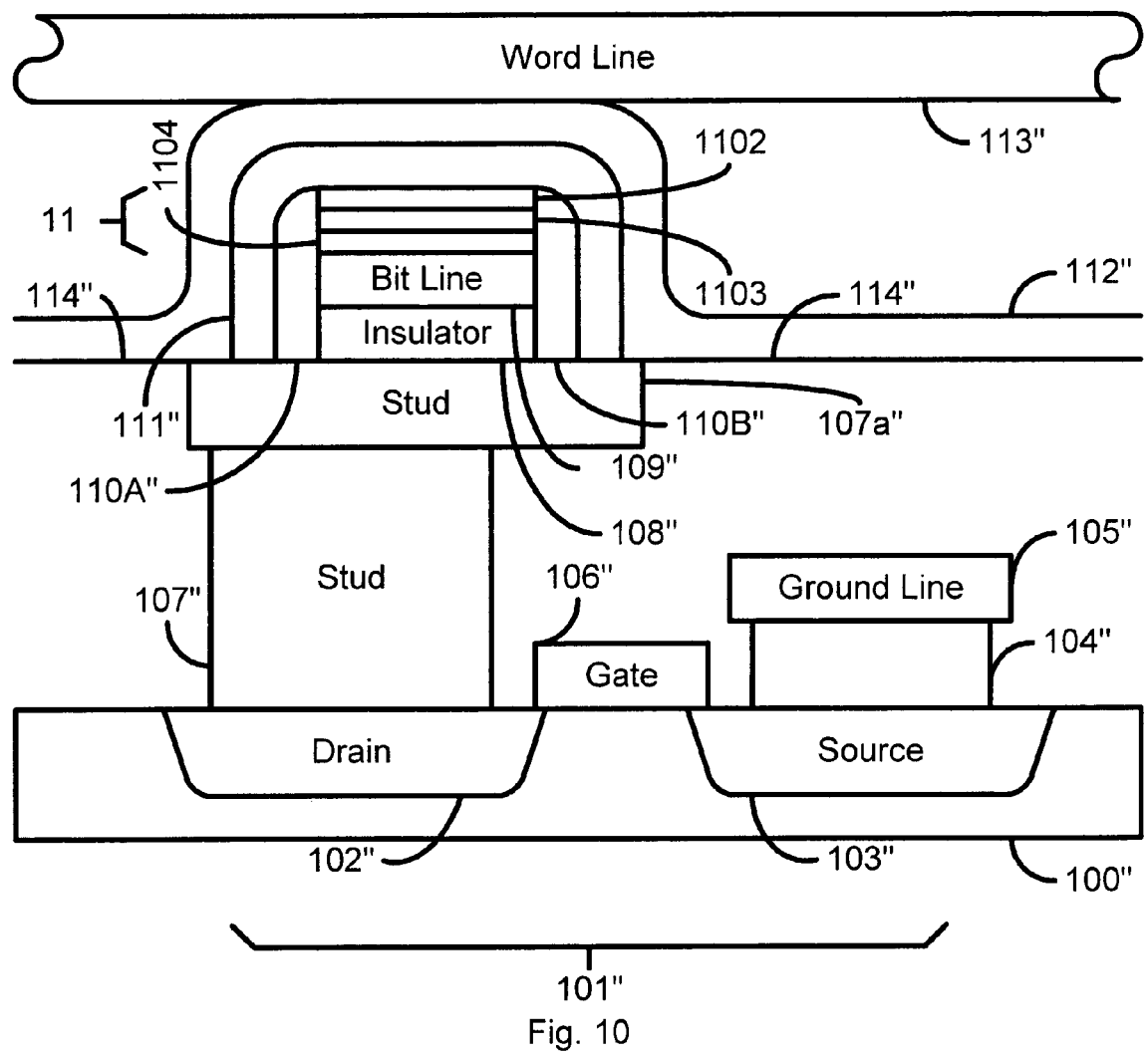
FIG. 10 is a cross-sectional view of a third embodiment of an MRAM architecture in accordance with the present invention wherein the MTJ is located directly on top of the stud.

FIG. 10 depicts a third embodiment of an MRAM cell in accordance with the present invention that can address this potential issue. Many of the components of the MRAM cell shown in FIG. 10 are analogous to those depicted in FIGS. 4–8c. Consequently, these components are labeled similarly. For example, the bit line 109" corresponds to the bit line 109 depicted in FIGS. 4–8c. In the MRAM cell depicted in FIG. 10 the MTJ stack 11" and the bit line 109" reside completely on top of the stud 107" and completely off of the surface of the dielectric 114". The size of the stud 107 is adjusted to accommodate the dimension of the MTJ stack 11. Thus, in the embodiment depicted in FIG. 10, the stud 107" includes two parts, a stud 107" and a top portion 107A".

Figure 11:
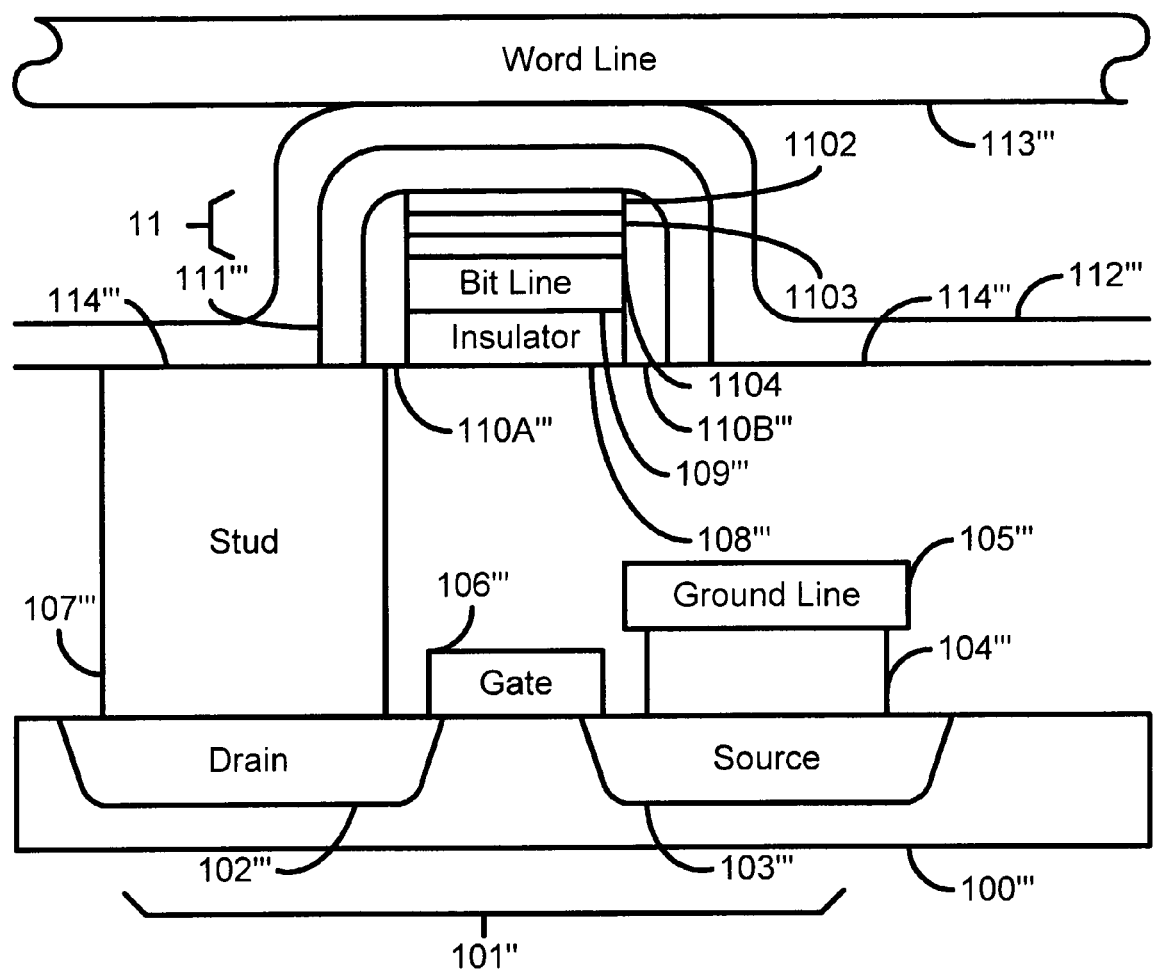
FIG. 11 is a cross-sectional view of a fourth embodiment of an MRAM architecture in accordance with the present invention wherein the MTJ stack does not overlap the stud.

FIG. 11 depicts a fourth embodiment of an MRAM cell in accordance with the present invention. Many of the components of the MRAM cell shown in FIG. 11 are analogous to those depicted in FIGS. 4–8c. Consequently, these components are labeled similarly. For example, the bit line 109'"

corresponds to the bit line 109 depicted in FIGS. 4–8*c*. In the embodiment depicted in FIG. 11, the MTJ stack 11 and the bit line 109 is completely located on the surface of the dielectric layer 114'''.

Figure 12:
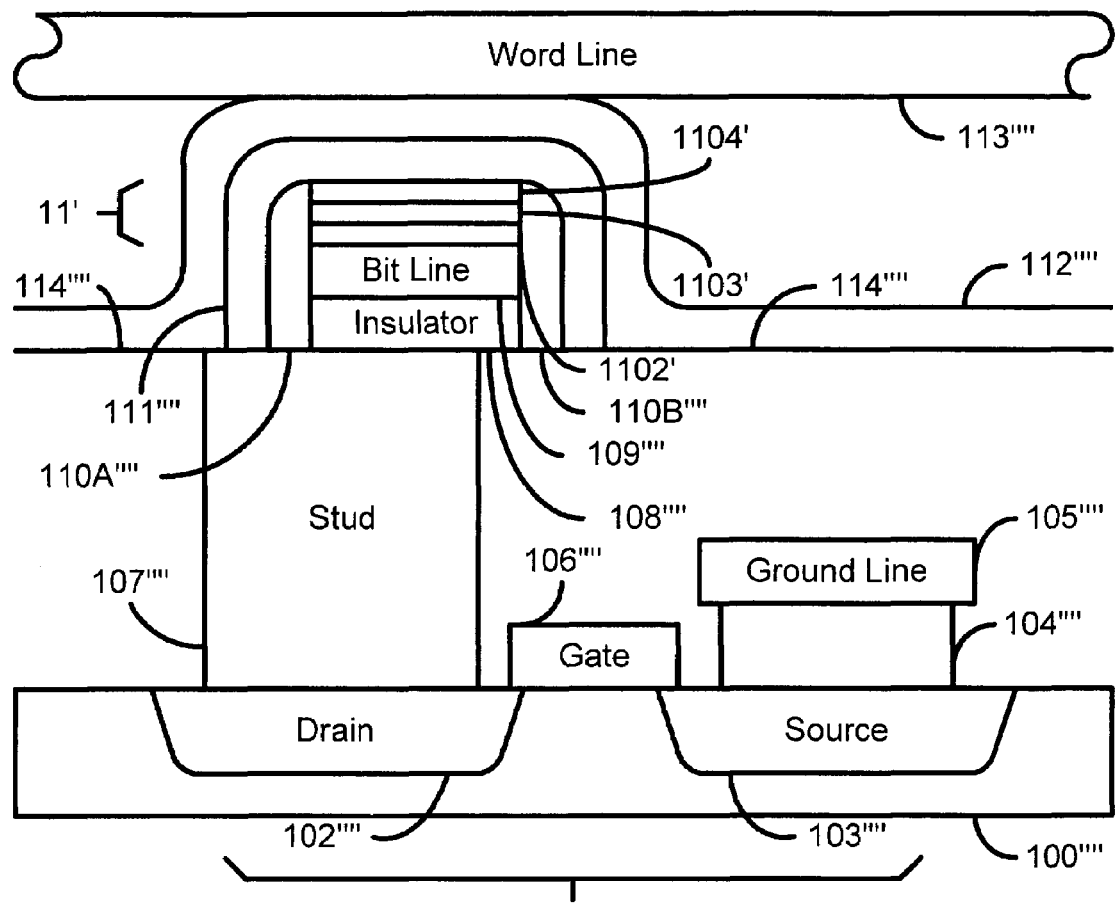
FIG. 12 is a cross-sectional view of a fifth embodiment of an MRAM architecture in accordance with the present invention wherein the MTJ stack has the pinning layer and the pinned layer on the bottom and the free layer on the top of the stack.

In the embodiment depicted in FIG. 4, the pinned layer 1102 is deposited after the deposition of free layer 1104. FIG. 12 depicts a fifth embodiment of an MRAM cell in accordance with the present invention. Many of the components of the MRAM cell shown in FIG. 12 are analogous to components depicted in FIG. 4–8*c*. Consequently, these components are labeled similarly. For example, the bit line 109'''' corresponds to the bit line 109 depicted in FIGS. 4–8*c*. In the MRAM depicted FIG. 12, the free layer 1104' of the MRJ stack 11' is deposited after the pinned layer 1102'. While the first embodiment depicted in FIG. 4 allows small spacing between bit line 109 and free layer 1104, the fifth embodiment depicted in FIG. 12 allows the pinned layer 1102' to be left in the same lateral shape as the bit line 109'''' without having to be cut in segments in the direction along bit line 109'''' from electrical point of view.

Figure 13:
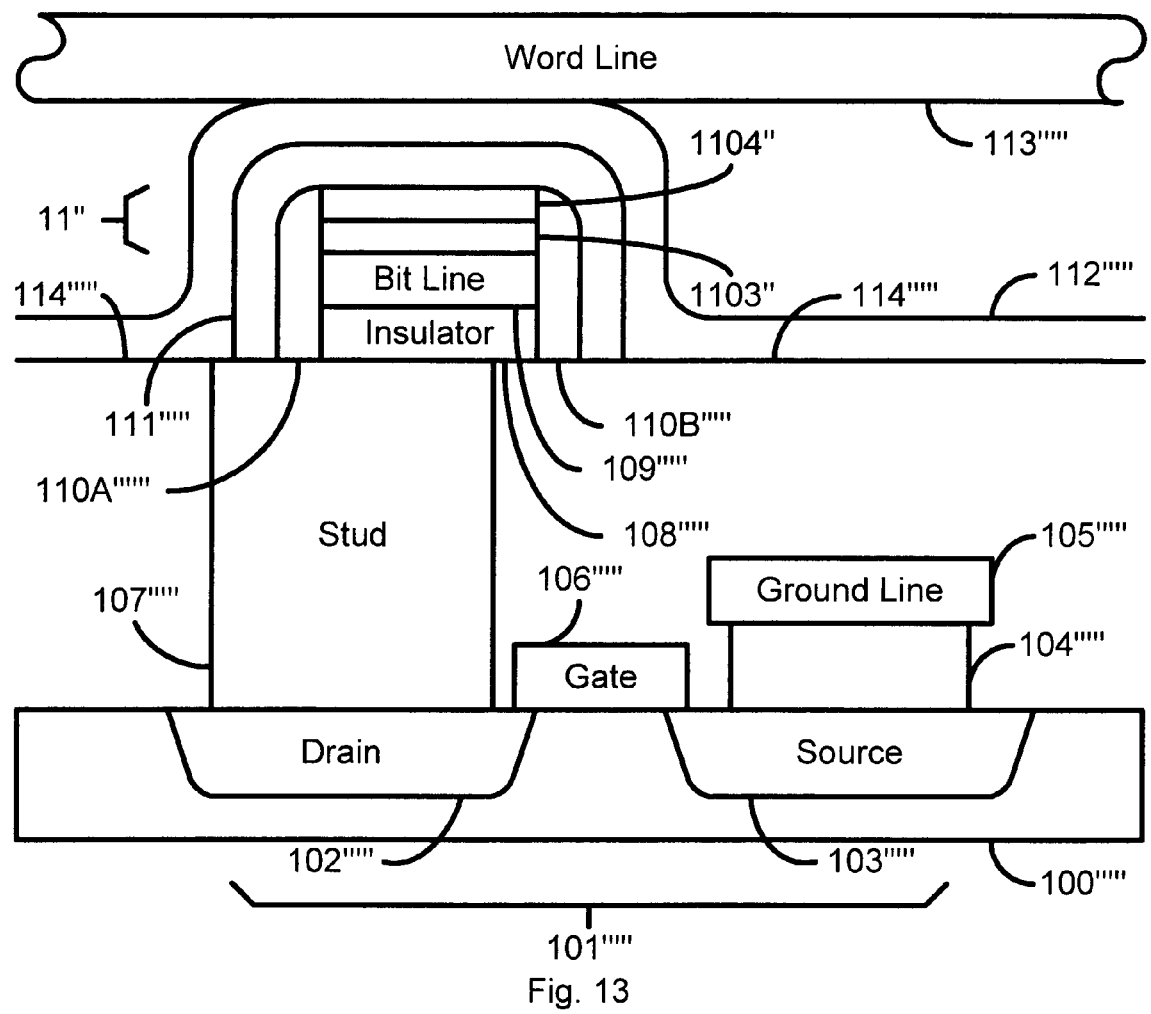
FIG. 13 is a cross-sectional view of a sixth embodiment an MRAM architecture in accordance with the present invention wherein the bit line is made of magnetic material and used as the reference layer (or pinned layer) of the MTJ devices.

FIG. 13 depicts a sixth embodiment of an MRAM cell in accordance with the present invention. Many of the components of the MRAM cell shown in FIG. 13 are analogous to those depicted in FIGS. 4–8*c*. Consequently, these components are labeled similarly. For example, the bit line 109'''' corresponds to the bit line 109 depicted in FIGS. 4–8*c*. In the embodiment depicted in FIG. 13, the pinned layer 1102 in the sixth embodiment depicted in FIG. 13 is removed from the MTJ stack 11". Instead, the bit line 109 is made of magnetic material and functions as both the bit line and the pinned layer. Thus, a portion of the bit line 109'''' directly under the remaining portion of the MTJ stack 11 functions as the pinned layer for the MTJ stack 11". The magnetic bit line 109'''' can either have an antiferromagnetic (AFM) pinning layer to fix the magnetization direction of bit line 109'''' through exchange coupling, or use shape anisotropy to maintain the magnetization direction substantially along the long axis of bit line 109''''. If an AFM pinning layer is utilized, the AFM layer could orient the magnetization direction of bit line 109'''' either along or orthogonal to its long axis.

Thus, the MRAM memories depicted in FIGS. 4 and 6*a*–13 provide an MRAM architecture that can be fabricated using a simpler process, such as those depicted in FIGS. 5*a*–5*b*. In addition, the simplified fabrication process and MRAM architecture allow for better scalability to smaller MRAM cell sizes. Furthermore, particularly where one or more magnetic or magnetic cladded write lines are used, the MRAM architecture offers improved writing efficiency in combination with better scalability and simplified fabrication.

A method and system has been disclosed for providing a magnetic memory having improved efficiency and simplified fabrication. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic random access memory cell comprising:
    a magnetic memory element having a top portion and a bottom portion, the magnetic memory element being a magnetoresistive element including a pinned layer, a free layer, and a nonmagnetic layer between the pinned layer and the free layer;
    a first write line below the magnetic memory element, the first write line being electrically connected with the bottom portion of the magnetic memory element;
    a second write line above the magnetic memory element, the second write line being electrically isolated from the magnetic memory element and oriented at an angle to the fist write line.

2. The magnetic random access memory cell of claim 1 wherein the angle is ninety degrees.

3. A magnetic random access memory cell comprising:
    a magnetic memory element having a top portion and a bottom portion;
    a first write line below the magnetic memory element, the first write line being electrically connected with the bottom portion of the magnetic memory element;
    a second write line above the magnetic memory element, the second write line being electrically isolated from the magnetic memory element and oriented at an angle to the first write line; and
    a selection device residing below magnetic memory element and the electrically connected to the top portion of the magnetic memory element.

4. The magnetic random access memory cell of claim 3 wherein the magnetic memory element is a magnetic tunneling junction device including a free layer having a changeable magnetic vector, a pinned layer having a fixed magnetic vector, and a thin insulating tunneling layer between the free layer and the pinned layer.

5. The magnetic random access memory cell of claim 4 wherein the pinned layer with the fixed magnetic vector is located on top of the thin insulating tunneling layer.

6. The magnetic random access memory cell of claim 4 wherein the pinned layer is located beneath the thin insulating tunneling layer.

7. The magnetic random access memory cell of claim 6 wherein the pinned layer has substantially the same lateral shape as the first write line.

8. A magnetic random access memory cell comprising:
    a magnetic memory element having a top portion and a bottom portion;
    a first write line below the magnetic memory element, the first write line being electrically connected with the bottom portion of the magnetic memory element;
    a second write line above the magnetic memory element, the second write line being electrically isolated from the magnetic memory element and oriented at an angle to the first write line, wherein the second write line further includes a central portion and an edge region, the edge region including not facing the magnetic memory element, the edge region including a ferromagnetic cladding layer, thereby concentrating a magnetic field proximate to the magnetic memory element.

9. The magnetic random access memory cell of claim 8 wherein the ferromagnetic cladding layer is electrically isolated from the central portion or the second write line.

10. A magnetic random access memory cell comprising:
    a magnetic memory element having a top portion and a bottom portion;
    a first write line below the magnetic memory element, the first write line being electrically connected with the bottom portion of the magnetic memory element, the first write line including a core including a soft magnetic material;

a second write line above the magnetic memory element, the second write line being electrically isolated from the magnetic memory element and oriented at an angle to the first write line.

11. A magnetic random access memory cell comprising:
magnetic memory element having a top portion and a bottom portion;
a first write line below the magnetic memory element, the first write line being electrically connected with the bottom portion of the magnetic memory element and including a soft magnetic material;
a second write line above the magnetic memory element, the second write line being electrically isolated from the magnetic memory element and oriented at an angle to the first write line;
wherein the first write line is magnetostatically coupled to the magnetic memory element.

12. A magnetic random access memory cell comprising:
a magnetic memory element having a top portion and a bottom portion;
a first write line below the magnetic memory element, the first write line being electrically connected with the bottom portion of the magnetic memory element;
a second write line above the magnetic memory element, the second write line being electrically isolated from the magnetic memory element and oriented at an angle to the first write line;
wherein the first write line is a multilayer structure including at least one nonmagnetic layer and at least one soft magnetic layer adjacent to the at least one nonmagnetic layer.

13. The magnetic random access memory cell of claim 12 wherein the at least one soft magnetic layer includes a plurality of soft magnetic layers and wherein the at least one nonmagnetic layer includes a plurality of nonmagnetic layers, and wherein each of the plurality of soft magnetic layers is alternated with each of the plurality of nonmagnetic layers.

14. A magnetic random access memory cell comprising:
a magnetic memory element having a top portion and a bottom portion;
a first write line below the magnetic memory element, the first write line being electrically connected with the bottom portion of the magnetic memory element;
a second write line above the magnetic memory element, the second write line being electrically isolated from the magnetic memory element and oriented at an angle to the first write line;
a selection device residing below magnetic memory element and the electrically connected to the top portion of the magnetic memory element; and
a conductive stud having a lateral geometry, the stud for electrically connecting the magnetic element and the selection device and residing between the magnetic memory element and the selection device; and
wherein the magnetic memory element is formed within a region delineated by the lateral geometry of the stud.

15. A magnetic random access memory cell comprising:
a magnetic memory element having a top portion and a bottom portion;
a first write line below the magnetic memory element, the first write line being electrically connected with the bottom portion of the magnetic memory element;
a second write line above the magnetic memory element, the second write line being electrically isolated from the magnetic memory element and oriented at an angle to the first write line;
a selection device residing below magnetic memory element and the electrically connected to the top portion of the magnetic memory element; and
a conductive stud having a lateral geometry, the stud for electrically connecting the magnetic element and the selection device and residing between the magnetic memory element and the selection device; and
wherein the magnetic memory element is formed outside a region delineated by the lateral geometry of the stud.

16. A magnetic random access memory cell comprising:
a magnetic memory element having a top portion and a bottom portion;
a first write line below the magnetic memory element, the first write line being electrically connected with the bottom portion of the magnetic memory element;
a second write line above the magnetic memory element, the second write line being electrically isolated from the magnetic memory element and oriented at an angle to the first write line;
a selection device residing below magnetic memory element and the electrically connected to the top portion of the magnetic memory element; and
a conductive stud having a lateral geometry, the stud for electrically connecting the magnetic element and the selection device and residing between the magnetic memory element and the selection device; and
wherein the magnetic memory element is formed partially within a region delineated by the lateral geometry of the stud.

17. A magnetic random access memory cell comprising:
a magnetic memory element having a top portion and a bottom portion;
a first write line below the magnetic memory element, the first write line being electrically connected with the bottom portion of the magnetic memory element; and
a second write line above the magnetic memory element, the second write line being electrically isolated from the magnetic memory element and oriented at an angle to the first write line.
wherein the first write line includes at least one layer of ferromagnetic material; and
wherein the magnetic element is a magnetic tunneling junction device including a pinned layer, a portion of the at least one layer of the first write line functioning as the pinned layer.

18. A magnetic random access memory comprising:
a plurality of magnetic memory elements, each of the plurality of magnetic memory elements having a top portion and a bottom portion, each of the plurality of magnetic memory elements being a magnetoresistive element including pinned layer, a free layer, and a nonmagnetic layer between the pinned layer and the free layer;
a first plurality of write lines below the plurality at magnetic memory elements, a write line of the first plurality of write lines being electrically connected with the bottom portion of a corresponding magnetic memory element of the plurality of magnetic memory elements;
a second plurality of write lines above the plurality of magnetic memory elements, the second plurality of write lines being electrically isolated from the plurality of magnetic memory elements, the second plurality of write lines being oriented at an angle to the first plurality of write lines, the plurality of magnetic memory elements residing at intersections between the first plurality of write lines and the second plurality of magnetic write lines.

* * * * *